(12) United States Patent  (10) Patent No.: US 7,592,760 B2
Butler et al.  (45) Date of Patent: Sep. 22, 2009

(54) LITHOGRAPHIC APPARATUS AND DEVICE MANUFACTURING METHOD

(75) Inventors: Hans Butler, Best (NL); Franciscus Adrianus Gerardus Klaassen, Best (NL)

(73) Assignee: ASML Netherlands B.V., Veldhoven (NL)

( * ) Notice: Subject to any disclaimer, the term of this patent is extended or adjusted under 35 U.S.C. 154(b) by 290 days.

(21) Appl. No.: 11/518,487

(22) Filed: Sep. 11, 2006

(65) Prior Publication Data

US 2008/0062394 A1 Mar. 13, 2008

(51) Int. Cl.
*H02K 41/00* (2006.01)

(52) U.S. Cl. .................. 318/135; 318/649; 318/687; 355/53; 355/18; 310/12; 310/14; 250/200; 250/203.7

(58) Field of Classification Search .................. 318/649, 318/135, 687; 355/53, 18; 250/200, 203, 250/7; 310/12, 14
See application file for complete search history.

(56) References Cited

U.S. PATENT DOCUMENTS 5,196,745 A 3/1993 Trumper
5,969,441 A * 10/1999 Loopstra et al. ............... 310/12
6,441,514 B1 8/2002 Markle
6,710,353 B1 * 3/2004 Loopstra ................. 250/441.11
7,126,666 B2 * 10/2006 De Weerdt et al. ............ 355/53
7,161,657 B2 * 1/2007 De Weerdt ................... 355/53
7,193,722 B2 * 3/2007 Boogaarts et al. ........... 356/500
2005/0030503 A1 * 2/2005 De Weerdt ................... 355/53
2005/0077786 A1 4/2005 De Weerdt
2005/0139790 A1 * 6/2005 Boogaarts et al. ........... 250/548
2005/0200826 A1 * 9/2005 Schmidt ....................... 355/72
2006/0132734 A1 * 6/2006 Luttikhuis et al. ............. 355/53
2007/0209437 A1 * 9/2007 Xue et al. ................. 73/514.31
2008/0024741 A1 * 1/2008 Butler et al. ................... 355/18
2008/0073561 A1 * 3/2008 Butler et al. ........... 250/440.11

* cited by examiner

*Primary Examiner*—Rita Leykin
(74) *Attorney, Agent, or Firm*—Pillsbury Winthrop Shaw Pittman LLP

(57) ABSTRACT

A positioning device configured to position a first and a second movable object in a substantially common operation area is presented. The positioning device includes a first coil assembly arranged next to the operation area, a second coil assembly arranged at an opposite side of the operation area, one or more first magnets arranged on the first movable object and configured to cooperate with the first coil assembly, and one or more second magnets arranged on the second movable object and configured to cooperate with the second coil assembly.

19 Claims, 3 Drawing Sheets

LITHOGRAPHIC APPARATUS AND DEVICE MANUFACTURING METHOD

BACKGROUND

1. Field

The present invention relates to a positioning device for positioning of movable object, a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon substrate). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus, a magnetic positioning device is used for the positioning of a substrate stage. In such apparatus, one or more coils cooperate with a number of magnets to actuate the substrate stage to a desired position.

In a known embodiment of such device the coils are arranged in a coil assembly attached to the substrate stage, while the magnets are included in a permanent magnet plate which is arranged substantially stationary next to the operation area of the substrate stage. An example of such arrangement is for instance disclosed in U.S. 2005/0077786, the contents of which is herein incorporated by reference. In this embodiment, the magnetic positioning apparatus is used for the coarse positioning of a long stroke module of the substrate stage. The long stroke module supports a short stroke module which is configured to carry a substrate. A high accuracy actuation device is provided between the long stroke module and the short stroke module to position the substrate supported on the short stroke module with high accuracy.

In an alternative embodiment of a magnetic positioning device, magnets are attached to the substrate stage, and coils are provided at a substantially stationary location next to the operation area. An example of the latter arrangement can for instance be found in U.S. Pat. No. 5,196,745, the contents of which is herein incorporated by reference. In the device of U.S. Pat. No. 5,196,745 a plurality of stage-attached permanent magnetic arrays are provided. Each of the magnetic arrays includes a series of adjacent oppositely poled permanent magnets that cooperate with stationary coil arrays in the horizontal plane to produce the proper lateral forces to move the substrate stage in the desired direction. The above-mentioned alternative embodiment of the magnetic positioning device has a benefit that since the magnets are provided on the substrate stage and the coils are arranged at a stationary position, the cables for energizing the coils do not have to be guided to the moving stage.

In certain lithographic apparatuses, two substrate stages are provided which can be moved in a substantially common operation area. Due to the presence of two substrate stages, the throughput of such dual stage lithographic apparatus can be substantially higher than a single stage lithographic apparatus.

In view of the above-mentioned benefit of the alternative embodiment of the magnetic positioning device, or an other suitable reason, it may desirable to use this alternative embodiment for the actuation of the two substrate stages of a dual stage lithographic apparatus. However, when two substrate stages have to move in a common operation area the alternative embodiment as proposed in U.S. Pat. No. 5,196,745 cannot be applied as the stationary coil arrays cannot be used to simultaneously actuate both the first substrate stage and the second substrate stage.

SUMMARY

It is desirable to provide a magnetic positioning device including a substantially stationary coil assembly and one or more movable magnets, whereby the positioning device is capable of actuating two movable objects, in particular two substrate stages in a substantially common operation area.

According to an embodiment of the invention, there is provided a positioning device configured to position a first movable object and a second movable object in a substantially common operation area, the positioning device including a first coil assembly arranged at one side of the operation area, a second coil assembly arranged at an opposite side of the operation area, a first magnet arranged on the first movable object and configured to cooperate with the first coil assembly, and a second magnet arranged on the second movable object and configured to cooperate with the second coil assembly.

According to an embodiment of the invention, there is provided a lithographic apparatus including a patterning device support constructed to support a patterning device, the patterning device being capable of imparting a radiation beam with a pattern in its cross-section to form a patterned radiation beam; a first substrate stage and a second substrate stage each constructed to hold a substrate and being movable in a common operation area, a projection system configured to project the patterned radiation beam onto a target portion of the substrate. The lithographic apparatus also includes a positioning device configured to position the first substrate stage and the second substrate stage in a substantially common operation area, the positioning device including a first coil assembly arranged at one side of the operation area, a second coil assembly arranged at an opposite side of the operation area, a first magnet arranged on the first substrate stage and configured to cooperate with the first coil assembly, and a second magnet arranged on the second substrate stage and configured to cooperate with the second coil assembly.

According to an embodiment of the invention, there is provided a positioning device configured to position a first movable object and a second movable object in a substantially common operation area, the positioning device including a first magnet arranged on the first movable object, a second magnet arranged on the second movable object, and three or more coil plates each including a coil assembly, the three or more coil plates being arranged adjacent to each other, and extending substantially in the same plane at one side of the substantially common operation area, wherein each of the three or more coil plates is configured to cooperate with the first magnet or the second magnet being located in the vicinity of the respective coil plate to actuate the first or second movable object, respectively.

According to an embodiment of the invention, there is provided a lithographic apparatus including a patterning device support constructed to support a patterning device, the patterning device being capable of imparting the radiation beam with a pattern in its cross-section to form a patterned radiation beam; a first substrate stage and a second substrate stage each constructed to hold a substrate and being movable in a common operation area, and a projection system configured to project the patterned radiation beam onto a target portion of the substrate. The lithographic apparatus also includes a positioning device configured to position the first substrate stage and the second substrate stage in a substantially common operation area, the positioning device including a first magnet arranged on the first movable object, a second magnet arranged on the second movable object, and three or more coil plates each including a coil assembly, the three or more coil plates being arranged adjacent to each other, and extending substantially in the same plane at one side of the substantially common operation area, wherein each of the three or more coil plates is configured to cooperate with the first magnet or the second magnet being located in the vicinity of the respective coil plate to actuate the first or second substrate stage, respectively.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
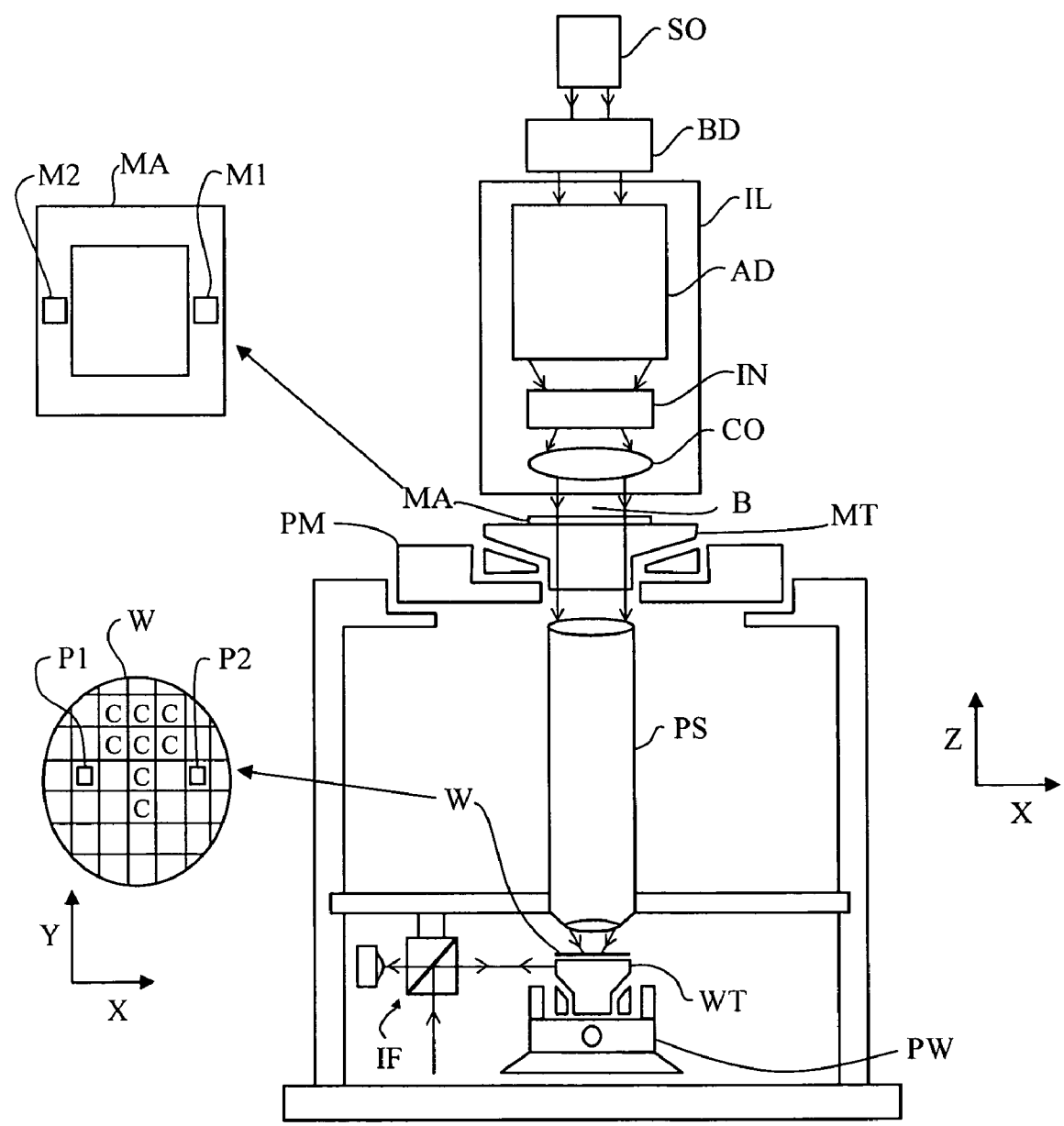
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a substrate table) WT or "substrate support" constructed to hold a substrate (e.g. a resist-coated substrate) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
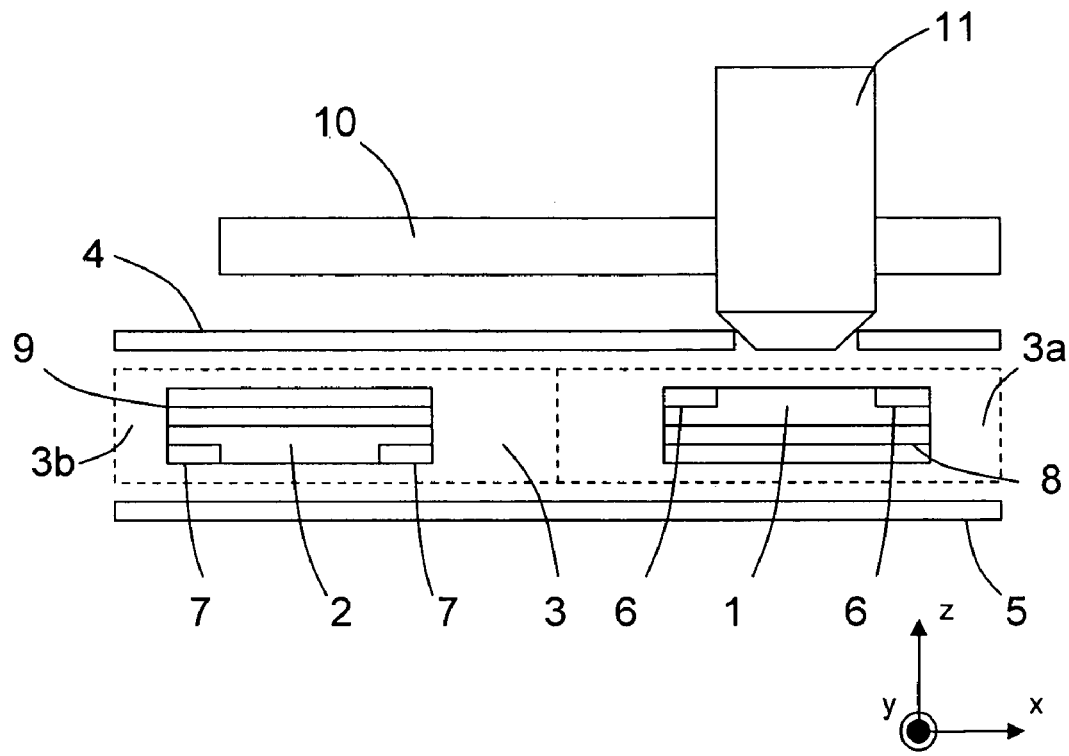
FIG. 2 depicts a schematic side view of an apparatus according to an embodiment of the invention.

FIG. 2 shows a magnetic positioning device according to an embodiment of the invention. The magnetic positioning device is configured to position a first substrate stage 1 and a second substrate stage 2 in a substantially common operation area 3. This operation area 3 includes an expose area 3a in which a radiation beam may be projected by the projection system 11 on a substrate which is carried by a respective substrate stage, and an exchange area 3b in which a substrate on a substrate stage may be exchanged for another substrate. It is desirable that both the first substrate stage 1 and the second substrate stage 2 can move in the operation area 3 so that in the time that a pattern is projected on a wafer carried by for instance the first substrate stage, the previously exposed wafer on the second substrate stage can be replaced by a new wafer or substrate, which is then measured on the second substrate stage in exchange area 3b. Consequently, after the projection process of the substrate on the first substrate stage 1 has finished, the substrate on the first substrate stage 1 can be exchanged and measured in the exchange area 3b, while the new substrate on the second substrate stage 2 is brought into the expose area in order to project a patterned beam on this substrate.

Thus, in the embodiment of FIG. 2 the first substrate stage 1 and the second substrate stage 2 may move within the common operation area 3 and may for instance swap between the positions shown in FIG. 2. Such lithographic apparatus including two substrate stages in a common operation area is often referred to as dual stage lithographic apparatus.

The positioning device includes a first coil plate 4 and a second coil plate 5. Both the first coil plate 4 and the second coil plate 5 are mounted at substantially stationary locations, for instance on a metro-frame 10, i.e. a frame which is substantially isolated from vibrations and on which the projection system 11 normally is mounted, or, preferably, another frame of the lithographic apparatus that guides the reaction forces to the outside world or to a balancing mass. The first coil plate 4 is arranged above the operation area 3, in particular between the metro-frame 10 and the operation area 3. In the first coil plate 4, a hole is provided so that the first coil plate 4 does not obstruct a radiation beam leaving the projection system 11. Other holes may be provided near exchange area 3b, for example to allow substrate measurement equipment to be connected to the metro-frame. The second coil plate 5 is arranged under the operation area 3. Both the first coil plate 4 and the second coil plate 5 extend substantially along the whole operation area in the horizontal plane in both the x-direction and the y-direction.

Attached to the first substrate stage 1 are a number of permanent magnets 6. Attached to the second stage 2 are also a number of permanent magnets 7. In alternative embodiments the magnets 6 and 7 may be electromagnets or any other type of magnets. However, it is preferred to use permanent magnets, for instance a number of Halbach magnet arrays. Permanent magnets have the benefit that no cables for energizing the magnets have to be guided to the magnets.

The coils of the first coil plate 4 are configured to cooperate with the magnets 6 of the first substrate stage 1. For this reason the magnets 6 are located at the side of the first substrate stage 1 which is closest to the first coil plate 4. The magnets 6 may be located at the top side of the first substrate stage 1, but to avoid interference with for instance the projection system 11, the magnets 6 may also be placed at the side of the first substrate stage, preferably close to the top surface of the first substrate stage 1, or at any other suitable location.

The coils of the second coil plate 5 are configured to cooperate with the magnets 7 of the second substrate stage 2. Correspondingly, the magnets 7 are located at the underside of the second substrate stage 2. The magnets 7 may be placed at the bottom surface of the second substrate stage 2, as shown in FIG. 2, or at any other suitable location, for instance at the side of the first substrate stage 2, preferably close to the bottom surface of the second substrate stage 2.

A first shielding device 8 is arranged on the first substrate stage 1 to shield the magnets 6 of the first substrate stage 1 from any influences of a magnetic field produced by the second coil plate 5. This shielding device 8 may be any device capable of substantially obstructing a magnetic field created by the second coil plate 5. For example, the shielding device 8 is a ferrous body provided at the bottom side of the permanent magnets 7, or a special material that shields magnetic fields but shows no attractive force to iron, like mu-metal. Correspondingly, a second shielding device 9 is provided on the second substrate stage 2 to shield the magnets 7 of the second substrate stage 2 from a magnetic field generated by the first coil plate 4.

By energizing the coils of the first coil plate 4, an electromagnetic field is created which may interact with the magnetic field of the permanent magnets 6 of the first substrate stage to create forces to move the first substrate stage 1 in a desired direction. In particular the forces are lateral forces on the substrate stage 1 to move the substrate stage in the x and/or y-direction.

Correspondingly, an electromagnetic field may be created by energizing the coils of the second coil plate 5 which may interact with the magnetic field of the permanent magnets 7 of the second substrate stage 2 to create forces to move the second substrate stage 2 in a desired direction.

The actuation of a movable object using permanent magnets on the movable object and stationary coils is in principle known to the man skilled in the art. A more detailed description of the principle of the cooperation between the coils of a coil plate and magnets on a movable object in order to actuate the movable object in two or more degrees of freedom can for instance be found in U.S. Pat. No. 6,441,514, the contents of which is herein incorporated by reference.

However in contrast to the embodiments described in U.S. Pat. No. 6,441,514, the provision of a first and a second stationary coil plate 4 and 5, each being associated with magnets attached to the first and second substrate stage 1 and 2, makes simultaneous actuation of two substrate stages in a common operation area possible.

Figure 3:
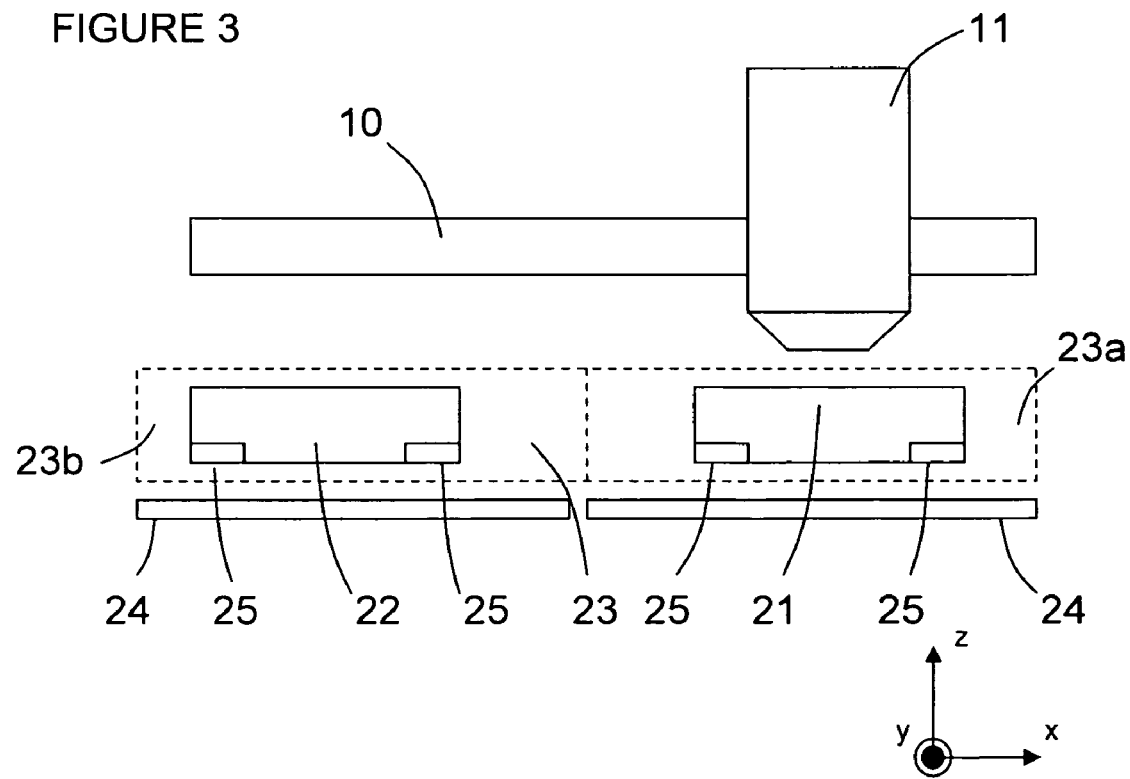
FIG. 3 depicts a schematic side view of an apparatus according to an embodiment of the invention.
Figure 4:
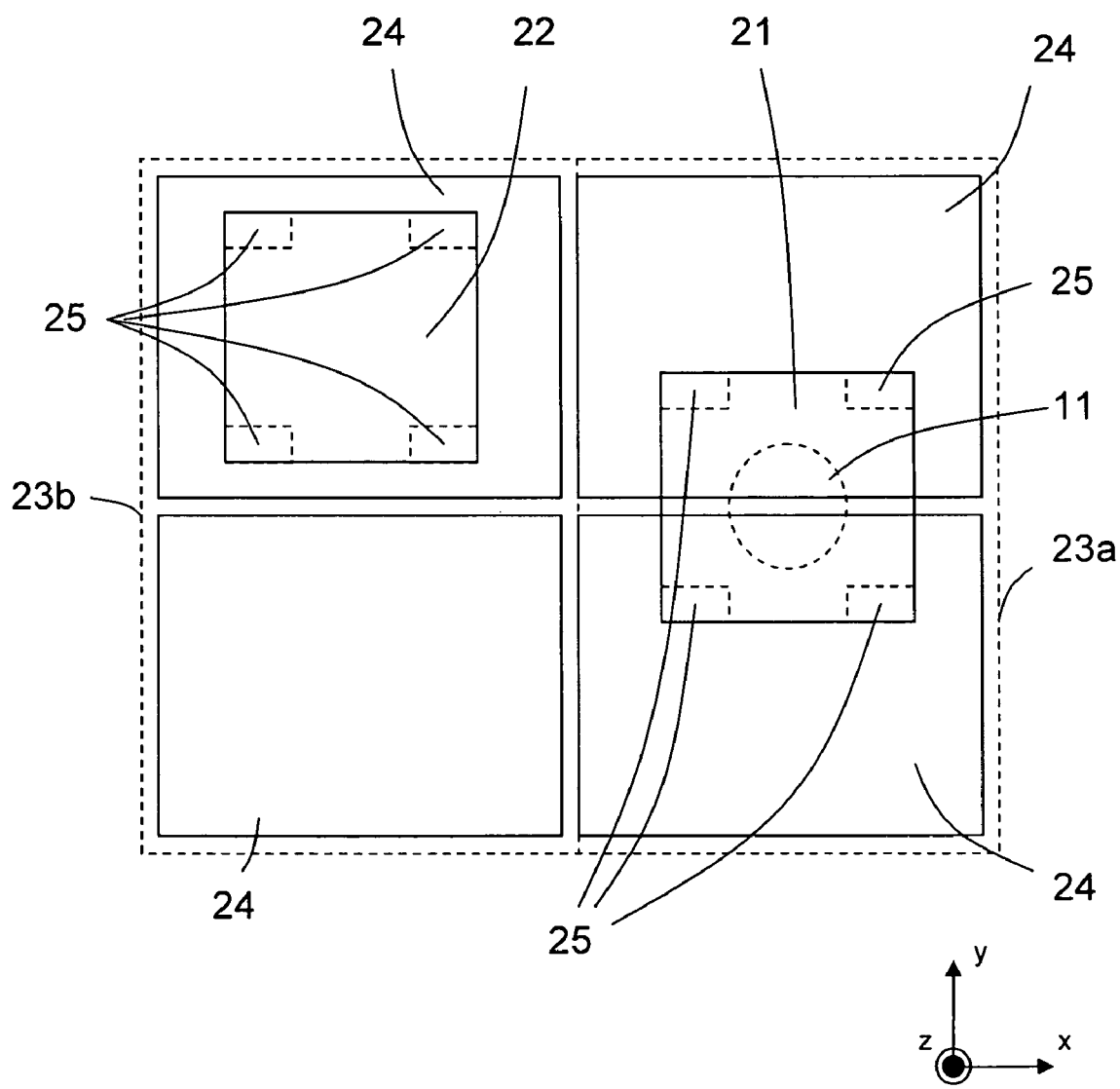
FIG. 4 depicts a schematic top view of the embodiment of FIG. 3.

FIGS. 3 and 4 show a magnetic positioning device according to another embodiment of the invention. The magnetic positioning device is configured to actuate a first substrate stage 21 and a second substrate stage 22 in a substantially common operation area 23. The operation area includes an expose area 23a at the side of the projection system 11 and an exchange and measurement area 23b. The magnetic positioning device is configured to move the first substrate stage 21 and the second substrate stage 22 throughout the operation area 23.

The positioning device of FIG. 3 includes four coil plates 24 each including a number of coils to provide a desired magnetic field upon energizing of the coils of the respective coil plate 24. The coil plates lie in substantially the same plane, in particular a horizontal plane under the operation area 23 and are arranged adjacent to each other. The four coil plates 24 extend together substantially along the whole operation area 23 to make actuation of the first substrate stage 21 and the second substrate stage 22 throughout the operation area possible. Only one of the first substrate stage 21 and the second substrate stage 22 can be actuated at the same time by the coils of one of the coil plates 24. The other of the first and second substrate stages 21, 22 may be actuated by one, or more, of the other coil plates 24

The first substrate stage 21 and the second substrate stage 22 include a number of permanent magnets 25 to cooperate with at least one of the coil plates 24. The magnets are arranged at the bottom side of the respective substrate stage, but may also be provided at a side of the substrate stage, or any other suitable location.

Upon energizing of the coils of one of the coil plates 24, the resulting electromagnetic field will interact with the magnetic field of one or more of the magnets 25 of a substrate stage 22 which is located above the respective coil plate 24, and as a result the respective substrate stage may be actuated in a desired direction. When a substrate stage located above a first coil plate is moved over an edge between the first coil plate and a second coil plate, the second coil plate may take over the actuation of the substrate stage (see FIG. 4). In this way the first substrate stage 21 and the second substrate stage 22 may be moved through the operation area, whereby continuous actuation of both substrate stages 21 and 22 is possible.

During the crossing the magnets 25 at one side of the substrate stage may be actuated by a first coil plate 24 while the magnets 25 at the other side of the substrate stage are actuated by a second coil plate 24. For example, in normal operation, substrate stage 21 in operation area 3a may be actuated by the two rightermost coil plates 24. Simultaneously, substrate stage 22 may perform measurement or exchange activities in operation area 23b, being actuated by the two leftmost coil plates 24. At some point, the two substrate stages may be swapped, substrate stage 21 moving from operation area 23a to area 23b moving along the top two coil plates 24. Simultaneously, substrate stage 22 may move from area 3b to area 3a along the bottom two coil plates 24. This way, the two substrate stages are always actuated by at most two coil plates, the other stage being actuated by at most two other coil plates. No coil plate is ever actuating two stages at the same time.

In an alternative embodiment it is possible that the magnetic positioning device includes a different number of coil plates. To make continuous actuation of both substrate stages possible there should be at least three coil plates 24 so that there is always one coil plate for one substrate stage, while the other substrate stage is crossing between two substrate stages.

Hereinabove, two embodiments of the invention have been described. Both embodiments are directed to the actuation of two substrate stages in a common operation area using a magnetic positioning device. The magnetic positioning according to an embodiment of the invention may also be used for the actuation of any other pair of movable objects to be actuated in a common operation area, such as for instance two reticle stages. Also, an embodiment of the invention may be applied for the actuation of three or more movable object in a common operation area.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning device configured to position a first movable object and a second movable object in a substantially common operation area, the positioning device comprising:
   a first coil assembly arranged at one side of the operation area;
   a second coil assembly arranged at an opposite side of the operation area;
   a first magnet arranged on the first movable object and configured to cooperate with the first coil assembly; and
   a second magnet arranged on the second movable object and configured to cooperate with the second coil assembly,
   wherein the first and second coil assemblies extend substantially over the whole common operation area.

2. The positioning device of claim 1, wherein the first magnet of the first movable object is arranged at a side of the first movable object where the first coil array is arranged, and wherein the second magnet of the second movable object is arranged at a side of the second movable object where the second coil array is arranged.

3. The positioning device of claim 1, wherein the positioning device comprises a first shielding device arranged on the first movable object and configured to substantially shield the first magnet of the first movable object from influence of the second coil assembly.

4. The positioning device of claim 1, wherein the positioning device comprises a second shielding device arranged on the second movable object and configured to substantially shield the second magnet of the second movable object from influence of the first coil assembly.

5. The positioning device of claim 1, wherein the positioning device is configured to actuate each of the first and the second movable objects in at least two degrees of freedom.

6. The positioning device of claim 1, wherein the positioning device is configured to actuate each of the first and second movable objects in a horizontal plane.

7. The positioning device of claim 1, wherein the first coil assembly comprises a plurality of coils arranged in a first coil plate, and the second coil assembly comprises a plurality of coils arranged in a second coil plate.

8. A lithographic apparatus comprising:
   a patterning device support constructed to support a patterning device, the patterning device being capable of imparting a radiation beam with a pattern in its cross-section to form a patterned radiation beam;
   a first substrate stage and a second substrate stage each constructed to hold a substrate and being movable in a common operation area;
   a projection system configured to project the patterned radiation beam onto a target portion of the substrate; and
   a positioning device configured to position the first substrate stage and the second substrate stage in the common operation area, the positioning device comprising
      a first coil assembly arranged at one side of the operation area,
      a second coil assembly arranged at an opposite side of the operation area, a first magnet arranged on the first substrate stage and configured to cooperate with the first coil assembly, and a second magnet arranged on the second substrate stage and configured to cooperate with the second coil assembly, wherein the first and second coil assemblies extend substantially over the whole common operation area.

9. The lithographic apparatus of claim 8, wherein the first coil assembly is arranged at a side of the operation area where the projection system is located.

10. The lithographic apparatus of claim 9, wherein the first coil assembly is arranged in a first coil plate, and wherein the first coil plate comprises an opening for the projection system.

11. A positioning device configured to position a first movable object and a second movable object in a substantially common operation area, the positioning device comprising:
    a first magnet arranged on the first movable object;
    a second magnet arranged on the second movable object; and
    three or more coil plates each comprising a coil assembly, the three or more coil plates being arranged adjacent to each other, and extending substantially in a same plane at one side of the substantially common operation area,
    wherein each of the three or more coil plates is configured to cooperate with the first magnet or the second magnet to actuate the first or second movable object, respectively.

12. The positioning device of claim 11, wherein, during actuation of the first or second movable object with one of the three or more coil plates, the first magnet or the second magnet is located above the one of the three or more coil plates.

13. The positioning device of claim 11, wherein, during operation, the first movable object is actuated by at least a first coil plate of the three or more coil. plates and the second movable object is actuated by at least a second coil plate of the three or more coil plates.

14. The positioning device of claim 11, wherein, when the first movable object is moved from a first coil plate of the three or more coil plates to a second coil plate of the three or more coil plates, the second movable object is actuated by at least a third coil plate of the three or more coil plates.

15. The positioning device of claim 11, wherein the positioning device comprises four or more adjacent coil plates extending substantially in a same plane.

16. The positioning device of claim 11, wherein the three or more coil plates cover the whole operation area of the first movable object and the second movable object.

17. A lithographic apparatus comprising:
    a patterning device support constructed to support a patterning device, the patterning device being capable of imparting a radiation beam with a pattern in its cross-section to form a patterned radiation beam;
    a first substrate stage and a second substrate stage each constructed to hold a substrate and being movable in a common operation area;
    a projection system configured to project the patterned radiation beam onto a target portion of the substrate; and
    a positioning device configured to position the first substrate stage and the second substrate stage in a substantially common operation area, the positioning device comprising
    a first magnet arranged on the first substrate stage,
    a second magnet arranged on the second substrate stage, and
    three or more coil plates each comprising a coil assembly, the three or more coil plates being arranged adjacent to each other, and extending substantially in a same plane at one side of the substantially common operation area, each of the three or more coil plates configured to cooperate with the first magnet or the second magnet to actuate the first or second substrate stage, respectively.

18. A device manufacturing method comprising:
    projecting a patterned beam of radiation onto a substrate; and
    positioning a first substrate stage and a second substrate stage in a common operation area with a positioning device, each of the first and second substrate stages configured to support the substrate, the positioning device comprising
    a first coil assembly arranged at one side of the operation area,
    a second coil assembly arranged at an opposite side of the operation area,
    a first magnet arranged on the first substrate stage and configured to cooperate with the first coil assembly, and
    a second magnet arranged on the second substrate stage and configured to cooperate with the second coil assembly.

19. A positioning device configured to position a first substrate table and a second substrate table of a lithographic apparatus in a substantially common operation area, the positioning device comprising:
    a first and a second coil assembly extending substantially over the common operation area, the first and the second substrate tables arranged between the first and the second coil assemblies;
    a first magnet assembly arranged on the first substrate table and configured to cooperate with the first coil assembly to move the first substrate table in the common operation area; and
    a second magnet assembly arranged on the second substrate table and configured to cooperate with the second coil assembly to move the second substrate table in the common operation area.

* * * * *